(12) United States Patent
Hsieh et al.

(10) Patent No.: US 12,402,243 B2
(45) Date of Patent: Aug. 26, 2025

(54) CIRCUIT CARRIER BOARD

(71) Applicant: Asia Pacific Microsystems, Inc., Hsinchu (TW)

(72) Inventors: Jer-Wei Hsieh, Hsinchu (TW); Hung-Lin Yin, Hsinchu (TW)

(73) Assignee: ASIA PACIFIC MICROSYSTEMS, INC., Hsinchu (TW)

( * ) Notice: Subject to any disclaimer, the term of this patent is extended or adjusted under 35 U.S.C. 154(b) by 218 days.

(21) Appl. No.: 18/481,097

(22) Filed: Oct. 4, 2023

(65) Prior Publication Data
US 2024/0292517 A1  Aug. 29, 2024

(30) Foreign Application Priority Data

Feb. 24, 2023 (TW) ................... 112106912

(51) Int. Cl.
*H05K 1/02* (2006.01)
*H05K 1/03* (2006.01)
*H05K 1/11* (2006.01)
*H05K 1/18* (2006.01)

(52) U.S. Cl.
CPC .......... *H05K 1/0233* (2013.01); *H05K 1/024* (2013.01); *H05K 1/0306* (2013.01); *H05K 1/111* (2013.01); *H05K 1/184* (2013.01); *H05K 2201/0183* (2013.01); *H05K 2201/0206* (2013.01); *H05K 2201/083* (2013.01)

(58) Field of Classification Search
CPC ......... H05K 1/0233; H05K 2201/0183; H05K 2201/083
See application file for complete search history.

(56) References Cited

U.S. PATENT DOCUMENTS

2019/0274217 A1* 9/2019 Zhang ................. H05K 3/0026
2019/0279806 A1* 9/2019 Darmawikarta .... H01F 27/2804

FOREIGN PATENT DOCUMENTS

TW  201707022 A  2/2017
TW  202231159 A  8/2022

OTHER PUBLICATIONS

Search Report appended to an Office Action, which was issued to Taiwanese counterpart application No. 112106912 by the TIPO on Sep. 27, 2023, with an English translation thereof (2 pages).

\* cited by examiner

*Primary Examiner* — Sherman Ng
(74) *Attorney, Agent, or Firm* — HSML P.C.

(57) ABSTRACT

A carrier board includes a substrate having a first substrate surface, a second substrate surface, and a substrate hole that penetrates the first substrate surface and the second substrate surface; a magnet sheath disposed in the substrate hole to cover a hole boundary of the substrate hole, and including a first magnetic surface, a second magnetic surface, and an inner periphery that interconnects the first magnetic surface and the second magnetic surface; a first dielectric isolation layer and a second dielectric isolation layer respectively having outer surfaces facing away from the substrate; and a conductive metal layer covering the inner periphery of the magnet sheath and extending to overlie the outer surfaces of the first dielectric isolation layer and the second dielectric isolation layer.

15 Claims, 7 Drawing Sheets

CIRCUIT CARRIER BOARD

CROSS-REFERENCE TO RELATED APPLICATION

This application claims priority to Taiwanese Invention Patent Application No. 112106912, filed on Feb. 24, 2023.

FIELD

The disclosure relates to a circuit carrier board, and more particularly to a circuit carrier board having a magnet sheath.

BACKGROUND

In the field of electronic circuits or communications, electronic products often need to use carrier boards to integrate passive components such as resistors, capacitors or inductors to meet specific performance requirements or improve output characteristics. By disposing an inductor structure made of magnetic materials on a carrier board, noises or electromagnetic radiation may be reduced.

In micro-electromechanical systems, it is beneficial for a circuit carrier board such as a MEMS optical bench to integrate with inductor components for further noise reduction. That is to say, micromachining is performed to manufacture a two-dimensional or three-dimensional magnetic structure on the circuit carrier board so as to build integrated inductors.

When the substrate used for the circuit carrier board is a single crystal silicon substrate, micromachining methods such as dry etching or wet etching may be used to make grooves or holes on the single crystal silicon substrate, then the magnetic materials, such as ferrite-containing polymers, are filled into the grooves or holes so as to make the circuit carrier board embedded with inductors for facilitating integration with other structures or components, such as V-shaped grooves in a MEMS optical bench, AuSn solders, passive components, etc.

When the substrate used for the circuit carrier board is a glass substrate with good light transmission and insulation, laser processing, sandblasting, or mechanical processing may be used to make the grooves or the holes, and the magnetic materials may be filled into the grooves and the holes so as to make the circuit carrier board with embedded inductors. In addition, printed circuit boards (PCBs), which are often used for circuit carrier boards in electronic packaging, may also be processed by drilling and grinding so as to obtain the grooves or the holes and be filled with the magnetic materials to form the circuit carrier board with embedded inductors.

However, after filling the holes with the magnetic materials, the magnetic materials will be covered by a conductive layer in a subsequent process. When the conductive layer is subjected to a process for formation of a pattern (e.g., photolithography, etching procedure, de-masking procedure, or surface roughening procedure), the magnetic materials will be exposed and chemical solutions used in the process will come into contact with the magnetic materials, causing ferrite particles in the magnetic materials to be dissolved, the inductors damaged, and the chemical solutions contaminated, thereby lowering the production yield and component performance.

SUMMARY

Therefore, an object of the disclosure is to provide a circuit carrier board that can alleviate at least one of the drawbacks of the prior art.

According to the disclosure, the circuit carrier board includes a substrate, a magnet sheath, a first dielectric isolation layer, a second dielectric isolation layer, and a conductive layer.

The substrate has a first substrate surface, a second substrate surface that is opposite to the first substrate surface, and a substrate hole that penetrates the first substrate surface and the second substrate surface.

The magnet sheath is disposed in the substrate hole to cover a hole boundary of the substrate hole, and includes a first magnetic surface, a second magnetic surface that is opposite to the first magnetic surface, and an inner periphery that interconnects the first magnetic surface and the second magnetic surface.

The first dielectric isolation layer and the second dielectric isolation layer respectively have outer surfaces facing away from the substrate. The first dielectric isolation layer overlies the first substrate surface and the first magnetic surface, and the second dielectric isolation layer overlies the second substrate surface and the second magnetic surface.

The conductive metal layer covers the inner periphery of the magnet sheath and extends to overlie the outer surfaces of the first dielectric isolation layer and the second dielectric isolation layer.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
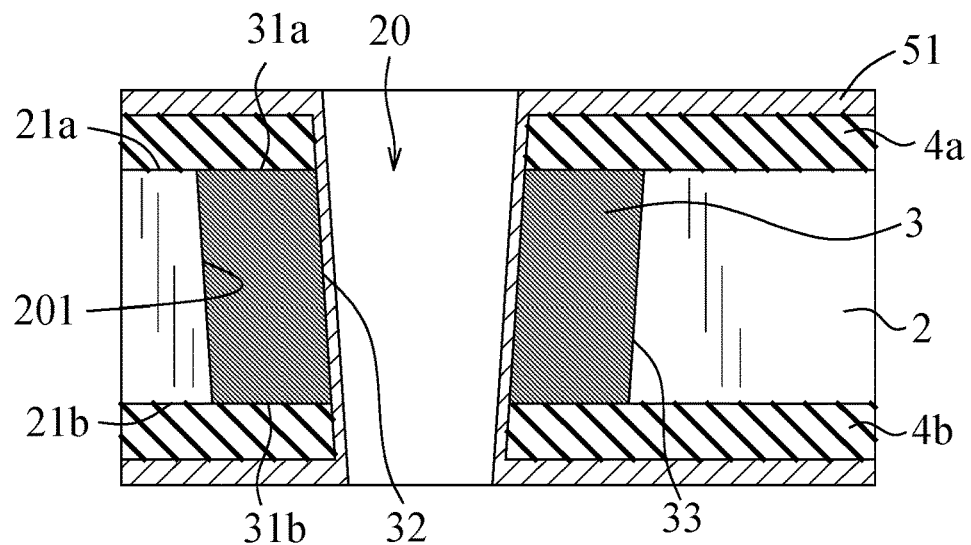
FIG. 1 is a schematic view illustrating a first embodiment of a circuit carrier board according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Referring to FIG. 1, a first embodiment of a circuit carrier board according to the disclosure includes a substrate 2, a magnet sheath 3, a first dielectric isolation layer 4a, a second dielectric isolation layer 4b opposite to the first dielectric isolation layer 4a, and a conductive metal layer 51.

Specifically, the substrate 2 has a first substrate surface 21a, a second substrate surface 21b that is opposite to the first substrate surface 21a, and a substrate hole 20 that penetrates the first substrate surface 21a and the second substrate surface 21b. The substrate hole 20 has a diameter and a shape that may vary with different processing methods. For example, the diameter of the substrate hole 20 may be uniform throughout or decreasing from one end to another in a direction from the first substrate surface 21a to the second substrate surface 21b. In this embodiment, the substrate hole 20 of the substrate 2 tapers in the direction from the first substrate surface 21a to the second substrate surface 21b, but is not limited thereto. The substrate 2 may be a silicon substrate, a glass substrate, a ceramic substrate, a copper foil substrate, or combinations thereof.

The magnet sheath 3 is disposed in the substrate hole 20 to cover a hole boundary 201 of the substrate hole 20, and includes a first magnetic surface 31a, a second magnetic surface 31b that is to opposite to the first magnetic surface 31a, an inner periphery 32 that interconnects the first magnetic surface 31a and the second magnetic surface 31b, and an outer periphery 33 that is opposite to the inner periphery 32 of the magnet sheath 3 and that contacts the hole boundary 201 of the substrate hole 20. The inner periphery 32 may be parallel to the hole boundary 201 of the substrate hole 20. The first magnet surface 31a and the second magnet surface 31b extend in a same direction as the first substrate surface 21a and the second substrate surface 21b. In certain embodiments, the first magnetic surface 31a and the second magnetic surface 31b are flush with the first substrate surface 21a and the second substrate surface 21b, respectively.

In this embodiment, the magnet sheath 3 is made of a material that includes an organic polymer resin, a conductive magnetic material, a curing agent (e.g., a composite curing agent), a filler, and an addictive. The organic polymer resin may be a thermosetting resin, a thermoplastic resin, or a combination thereof. The resin may include at least one of epoxy resin, phenolic resin, polyurethane, melamine, polyimide, polyamide, polyacetylene, or derived resin thereof. The conductive magnetic material may be any suitable material with magnetic properties, and may include a metal powder, a metal oxide powder, or a combination thereof. In this embodiment, the magnet sheath 3 includes one or more ferromagnetic or sub-ferromagnetic materials, including but not limited to: cobalt (Co), iron (Fe), magnesium (Mg), nickel (Ni), manganese (Mn), and their alloy or oxide, and combinations thereof.

The first dielectric isolation layer 4a and the second dielectric isolation layer 4b respectively have outer surfaces facing away from the substrate 2. The first dielectric isolation layer 4a overlies the first substrate surface 21a and the first magnetic surface 31a, and the second dielectric isolation layer 4b overlies the second substrate surface 21b and the second magnetic surface 31b. In this embodiment, the first magnetic surface 31a and the second magnetic surface 31b directly contact the first dielectric isolation layer 4a and the second dielectric isolation layer 4b, respectively.

The first and second dielectric isolation layers 4a, 4b may be formed of polymer or non-polymer materials, such as bismaleimie triacine (BT), ajinomoto build-up film (ABF film), polypropylene (PP), prepreg, epoxy, polyimide (PI), polydimethylsiloxane (PDMS), parylene, photoimageable dielectric (PID), silicon dioxide, silicon nitride, and combinations thereof.

The conductive metal layer 51 covers the inner periphery 32 of the magnet sheath 3. In other words, the inner periphery 32 of the magnet sheath 3 contacts the conductive metal layer 51. The conductive metal layer 51 also extends to overlie the outer surfaces of the first dielectric isolation layer 4a and the second dielectric isolation layer 4b.

In this embodiment, the circuit carrier board functions as an inductor, so as to achieve specific performance requirement and improve related input characteristics. In this embodiment, by having the first dielectric isolation layer 4a overlying the first substrate surface 21a and the first magnetic surface 31a, and the second dielectric isolation layer 4b overlying the second substrate surface 21b and the second magnetic surface 31b, the magnet sheath 3 is insulated and protected, such that in subsequent processing steps (e.g., etching, de-masking, roughening, etc.), the magnet sheath 3 is not exposed to chemical solutions, thereby keeping the magnet sheath 3 from damages so as to improve production yield and device performance.

For the sake of simplification, the first embodiment is illustrated in FIG. 1 as having one substrate hole 20; however, this is not a limitation of the first embodiment. In practice of the first embodiment, there may be more than one substrate hole 201.

Figure 2:
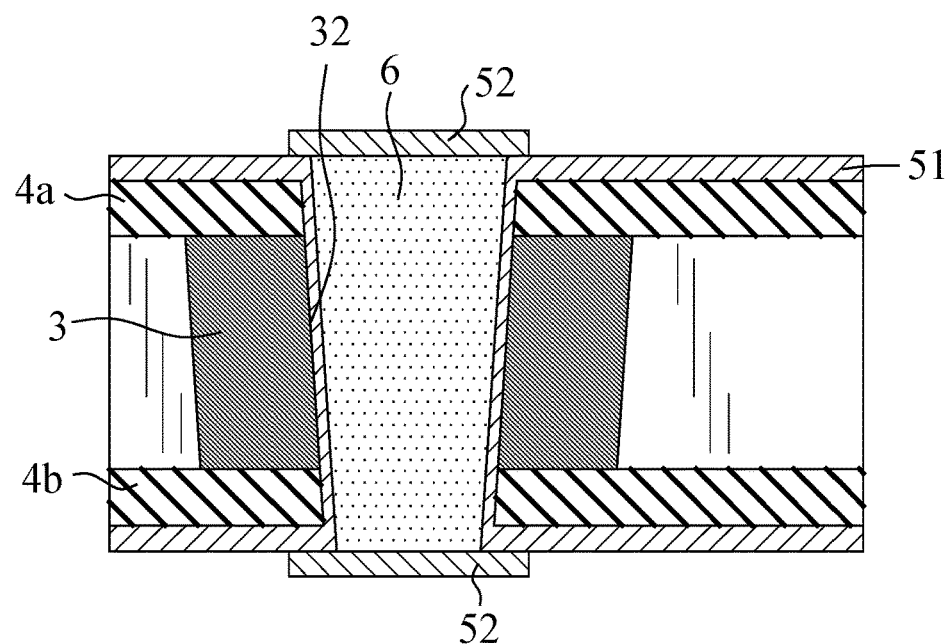
FIG. 2 is a schematic view illustrating a second embodiment of the circuit carrier board according to the disclosure.

Referring to FIG. 2, a second embodiment of the circuit carrier board of the disclosure is generally similar to the first embodiment except that, in the second embodiment, the circuit carrier board further includes a filler 6 and two contact pads 52. The filler 6 is disposed within the substrate hole 20 and is surrounded by a portion of the conductive metal layer 51 that overlies the inner periphery 32 of the magnet sheath 3. In particular, the filler 6 has two opposite outer ends respectively protruding and being exposed from the outer surfaces of the first dielectric isolation layer 4a and the second dielectric isolation layer 4b.

Figure 6:
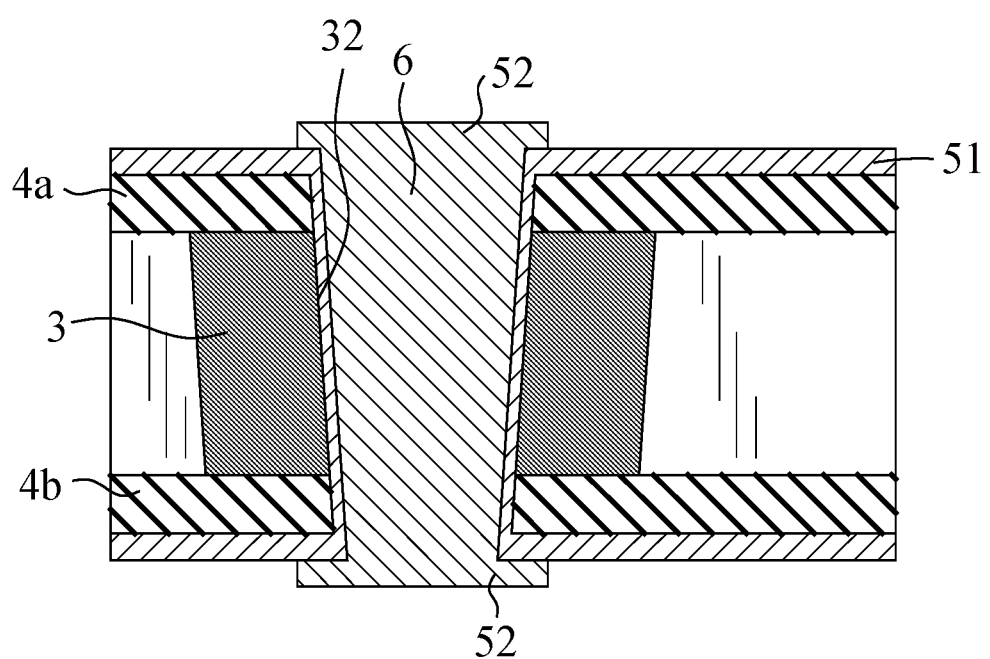
FIG. 6 is a schematic view illustrating an embodiment of the carrier board according to the disclosure.

The filler 6 may be a conductive filler or an insulating filler. The filler 6 may be selected from epoxy resin, silane (e.g., hexamethyldisiloxane, tetraethoxysilane, bis-dimethylamino dimethylsilazane), or combinations thereof. As shown in FIG. 6, the filler 6 and the contact pads 52 may be made of the same material.

The contact pads 52 cover the filler 6 and are connected to the conductive metal layer 51 overlying the outer surfaces of the first dielectric isolation layer 4a and the second dielectric isolation layer 4b.

Figure 3:
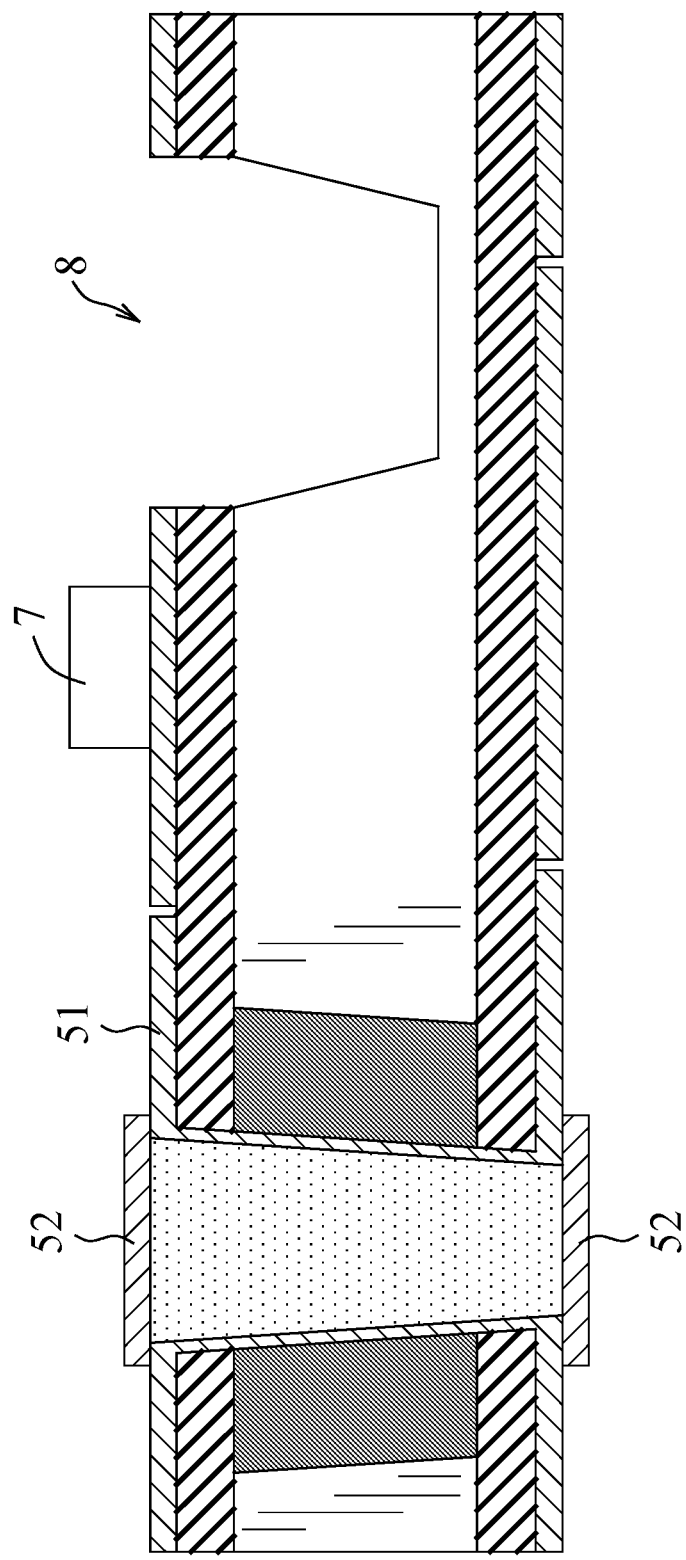
FIG. 3 is a schematic view illustrating a third embodiment of the circuit carrier board according to the disclosure.

Referring to FIG. 3, a third embodiment of the circuit carrier board of the disclosure is generally similar to the second embodiment except that, in this embodiment, the circuit carrier board further includes a metallic material 7 and a groove 8. Specifically, the metallic material 7, which may be an Under Bump Metallurgy (UBM) or AuSn solder for facilitating flip-chip bonding, is disposed on the conductive metal layer 51 for placement thereon an optical component such as a laser diode (not shown), or an electrical component (not shown) such as a resistor or a capacitor. The groove 8 is recessed into the substrate 2 for placement of an optical component (not shown) thereon, thereby facilitating integration with other components. In this embodiment, the groove has a V shaped or a U shaped cross-section.

Figure 4:
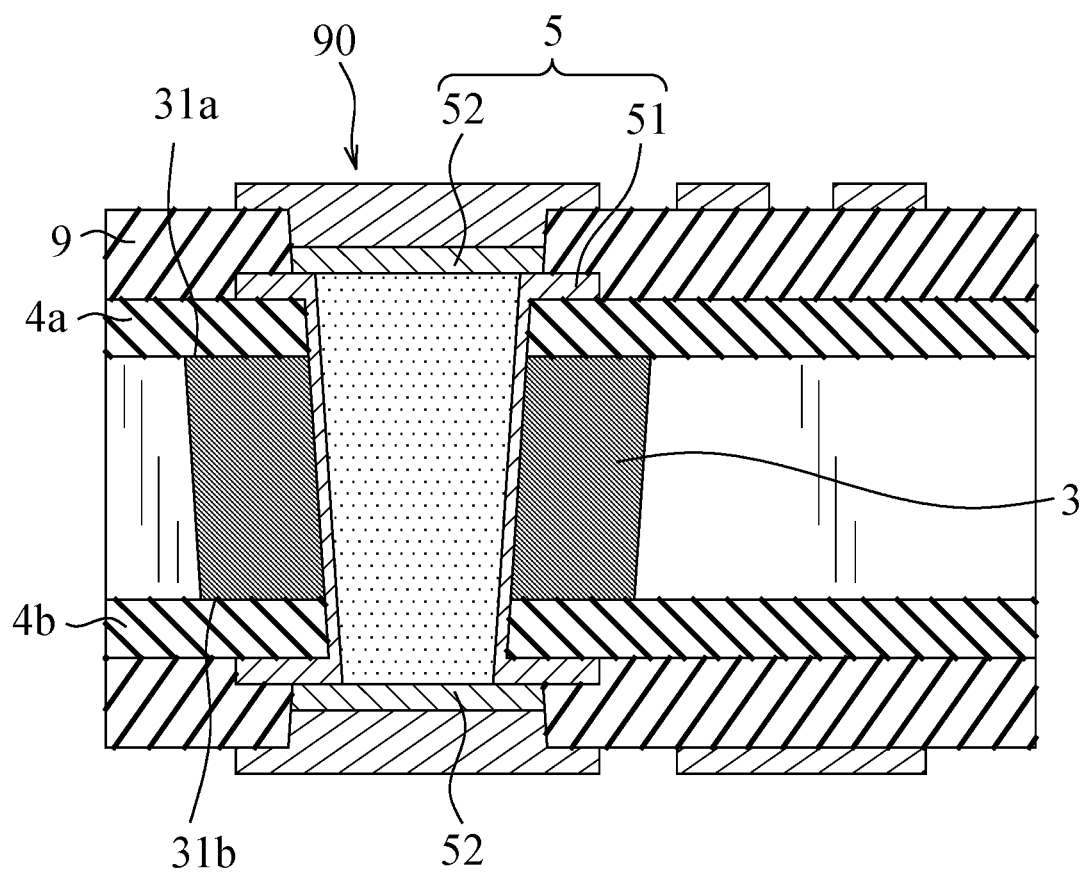
FIG. 4 is a schematic view illustrating a fourth embodiment of the circuit carrier board according to the disclosure.

Referring to FIG. 4, a fourth embodiment of the circuit carrier board of the disclosure is generally similar to the second embodiment. However, the circuit carrier board in the fourth embodiment further includes an insulating protection layer 9 and an electrical connection line unit 90. The insulating protection layer 9 covers a portion of the conductive metal layer 51 formed on the first dielectric isolation layer 4a and exposes one of the contact pads 52. The electrical connection line unit 90 is disposed on the insulating protection layer 9 and is connected to the one of the contact pads 52 exposed from the insulating protection layer 9. Moreover, in this embodiment, the conductive metal layer 51 overlies a part of the outer surface of the first dielectric isolation layer 4a and a part of the outer surface of the second dielectric isolation layer 4b.

In certain embodiments, a perpendicular projection of the conductive metal layer 51 onto one of the first magnetic surface 31a and the second magnetic surface 31b of the magnet sheath 3 has a maximum width no greater than a width of the one of the first magnetic surface 31a and the second magnetic surface 31b of the magnet sheath 3. That is to say, in these certain embodiments, the perpendicular projection of the conductive metal layer 51 falls within and does not extend beyond the one of the first magnetic surface 31a and the second magnetic surface 31b.

In yet certain embodiments, the perpendicular projection of the conductive metal layer 51 onto one of the first magnetic surface 31a and the second magnetic surface 31b of the magnet sheath 3 has a minimum width no greater than the width of the one of the first magnetic surface 31a and the second magnetic surface 31b of the magnet sheath 3. That is to say, in these yet certain embodiments, a portion of a boundary of the perpendicular projection of the conductive metal layer 51 may fall within the one of the first magnetic surface 31a and the second magnetic surface 31b, and another portion of the boundary of the perpendicular projection of the conductive metal layer 51 may fall outside of the one of the first magnetic surface 31a and the second magnetic surface 31b.

In some embodiments, the conductive metal layer 51 and the contact pads 52 constitute a conductive unit 5, and a perpendicular projection of the conductive unit 5 onto one of the first magnetic surface 31a and the second magnetic surface 31b of the magnet sheath 3 has a maximum width no greater than the width of the one of the first magnetic surface 31a and the second magnetic surface 31b of the magnet sheath 3. In such case, the perpendicular projection of the conductive unit 5 falls within the one of the first magnetic surface 31a and the second magnetic surface 31b.

In other embodiments, the perpendicular projection of the conductive unit 5 onto one of the first magnetic surface 31a and the second magnetic surface 31b of the magnet sheath 3 has a minimum width no greater than the width of the one of the first magnetic surface 31a and the second magnetic surface 31b of the magnet sheath 3. That is to say, a portion of a boundary of the perpendicular projection of the conductive unit 5 may fall within the one of the first magnetic surface 31a and the second magnetic surface 31b, and another portion of the boundary of the perpendicular projection of the conductive unit 5 may fall outside of the one of the first magnetic surface 31a and the second magnetic surface 31b.

By virtue of the first dielectric isolation layer 4a overlying the first substrate surface 21a and the first magnetic surface 31a, and the second dielectric isolation layer 4b overlying the second substrate surface 21b and the second magnetic surface 31b, the magnet sheath 3 and the substrate 2 are insulated from the conductive metal layer 51, so that the magnet sheath 3 is not exposed to chemical solutions in subsequent processing steps (e.g., etching, de-masking, roughening, etc.) when the conductive metal layer 51 is subjected to patterning (e.g., electrical connection lines or the like). This prevents damage to the magnet sheath 3 during subsequent processing steps, and designing of conductive traces for the conductive metal layer 51 is not limited by a need of covering or protecting the magnet sheath 3. By such configuration, a size of a conductive metal layer 51 or a size of the contact pads 52 is allowed to be smaller than a size of the magnet sheath 3, so that a dense wiring is easier to be achieved.

To explain structure of the carrier board of this disclosure in more detail, manufacturing steps of the circuit carrier board of the fourth embodiment are described as follows.

Referring to FIGS. 5A to 5J, first, the substrate 2 is selected from the silicon substrate, the glass substrate, the ceramic substrate, the copper foil substrate, or the combination thereof. Next, the substrate hole 20 is formed in the substrate 2. The number of the substrate hole 20 is not limited, but for simplicity of the description, only one substrate hole 20 is illustrated in the figures.

It should be noted that, when using different materials for the substrate 2, methods of forming the substrate hole 20 will also be different. For example, when the substrate 2 is made of silicon, dry etching or wet etching is generally used to form the substrate hole 20. When the substrate 2 is made of glass, laser drilling, sandblasting or mechanical processing is used to form the substrate 20. When the substrate 2 is made of copper foil, computer numerical control (CNC) drilling, grinding and other mechanical processing methods may be used to form the substrate hole 20.

Figure 5A:
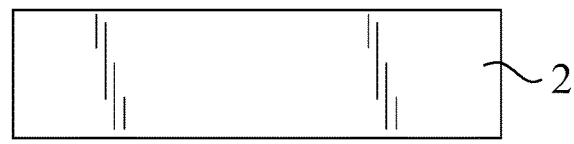
FIGS. 5A-5J illustrate consecutive processing steps of manufacturing the carrier board.
Figure 5B:
Figure 5C:
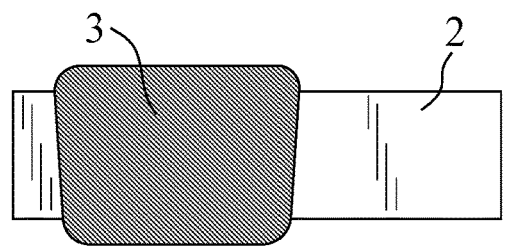
Figure 5D:
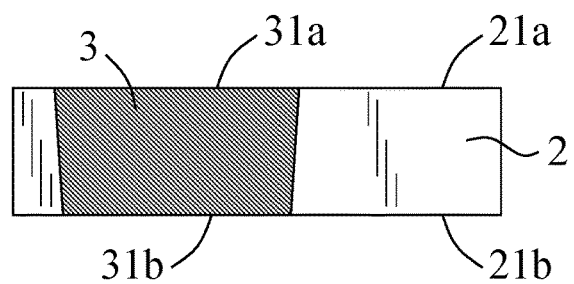

Next, the magnet sheath 3 is disposed in the substrate hole 20 so as to fill the substrate hole 20. The first magnetic surface 31a and the second magnetic surface 31b are subjected to brush grinding so that they are flush with the first substrate surface 21a and the second substrate surface 21b, respectively (as shown in FIG. 5D).

Figure 5E:
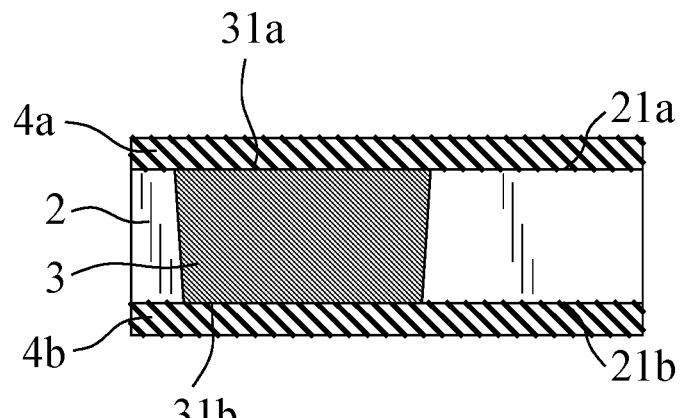
Figure 5F:
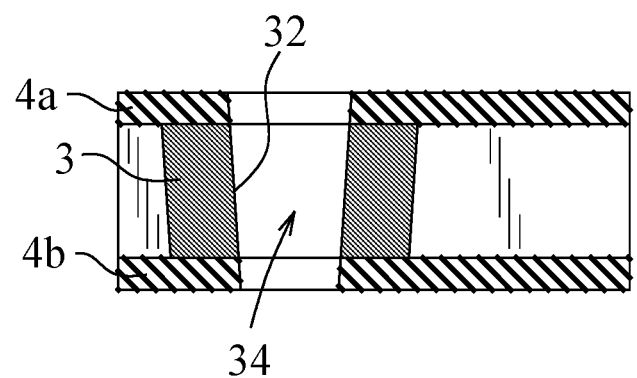

Then, the first dielectric isolation layer 4a is laminated or deposited onto the first substrate surface 21a and the first magnetic surface 31a, and the second dielectric isolation layer 4b is laminated or deposited onto the second substrate surface 21b and the second magnetic surface 31b (as shown in FIG. 5E). Drilling is conducted to form a through hole 34 in the magnet sheath 3 so that the magnet sheath 3 has the inner periphery 32 that defines the through hole 34 (as shown in FIG. 5F). That is to say, the magnet sheath 3 is not completely filled in the substrate hole 20.

Figure 5G:
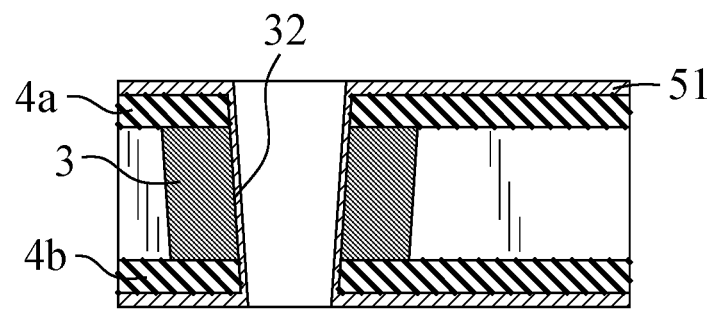
Figure 5H:
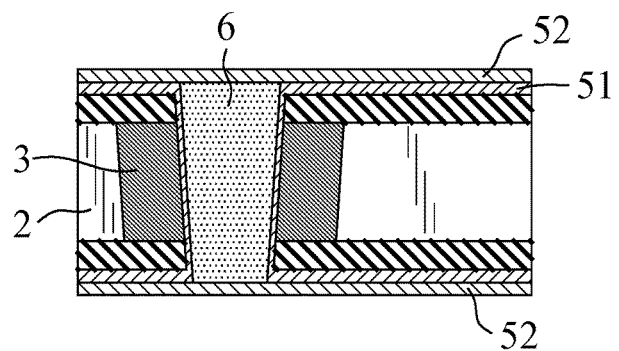

In the next step, by chemical plating or electroplating, the conductive metal layer 51 is formed on the outer surfaces of the first dielectric isolation layer 4a and the second dielectric isolation layer 4b and is allowed to extend and cover the inner periphery 32 of the magnet sheath 3 as shown in FIG. 5G.

Afterwards, the filler 6 is filled in the substrate hole 20 that is not occupied by the magnet sheath 3. Brush grinding is conducted so as to make the two outer ends of the filler 6 flush with the conductive metal layer 51. Next, by sputtering, chemical plating or electroplating, the contact pads 52 are formed to contact the conductive metal layer 51 and cover the filler 6 (see FIG. 5H), such that the conductive metal layer 51 and the contact pads 52 enclose the filler 6.

Figure 5I:
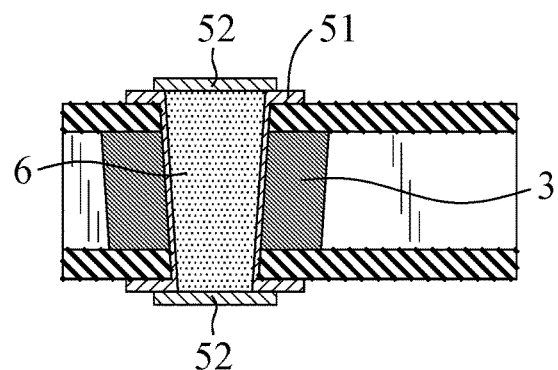
Figure 5J:
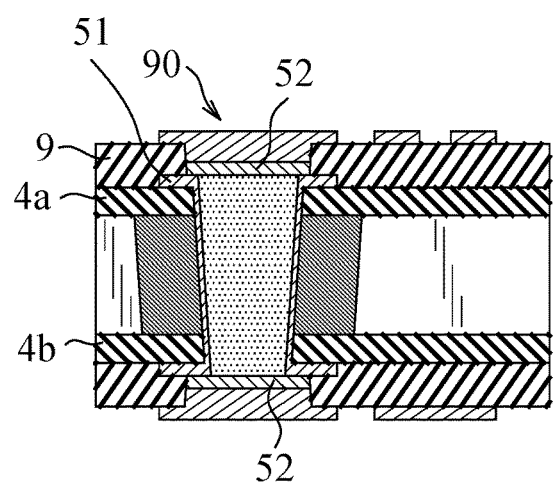

The conductive metal layer 51 and the contact pads 52 are further subjected to photolithography, etching procedure, de-masking procedure, and surface roughening so that parts of the conductive metal layer 51 and the contact pads 52 are removed (see FIG. 5I). A width of each of the conductive metal layer 51 and the contact pads 52 is smaller than a width of the magnet sheath 3. It should be noted that when the conductive metal layer 51 and the contact pads 52 are subjected to photolithography, etching, and mask-removing procedures, the magnet sheath 3 is protected by the dielectric isolation layers 4a, 4b, such that the magnet sheath 3 is not exposed to the chemical solutions, thereby effectively avoiding damage to the magnet sheath 3.

Finally, the insulating protection layer 9 is formed to cover the first and second dielectric isolation layers 4a, 4b and the conductive metal layer 51, while leaving the contact pads 52 being exposed. The electrical connection line unit 90 is then formed on the insulating protection layer 9 and is electrically connected to the exposed contact pads 52. Thus, the circuit carrier board is formed.

In summary, by virtue of the first dielectric isolation layer 4a covering the first magnetic surface 31a and the first substrate surface 21a, and the second dielectric isolation layer 4b covering the second magnetic surface 31b and the second substrate surface 21b, when processes such as photolithography, etching procedure, mask removing procedure, surface roughening procedure, etc. are conducted in subsequent procedures, the magnet sheath 3 is protected and not exposed, thereby improving process yields and component quality. In addition, by such configuration, the widths of the conductive metal layer 51 and the contact pads 52 may be smaller than the width of the magnet sheath 3, thereby meeting the requirements for a dense circuit. Thus, the purpose of this disclosure is achieved.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A circuit carrier board, comprising: a substrate having a first substrate surface, a second substrate surface that is opposite to said first substrate surface, and a substrate hole that penetrates said first substrate surface and said second substrate surface; a magnet sheath disposed in said substrate hole to cover a hole boundary of said substrate hole, and including a first magnetic surface, a second magnetic surface that is opposite to said first magnetic surface, and an inner periphery that interconnects said first magnetic surface and said second magnetic surface; a first dielectric isolation layer and a second dielectric isolation layer, said first dielectric isolation layer and said second dielectric isolation layer respectively having outer surfaces facing away from said substrate, said first dielectric isolation layer overlying said first substrate surface and said first magnetic surface, said second dielectric isolation layer overlying said second substrate surface and said second magnetic surface; a conductive metal layer covering said inner periphery of said magnet sheath and extending to overlie said outer surfaces of said first dielectric isolation layer and said second dielectric isolation layer; a filler disposed in said substrate hole and surrounded by a portion of said conductive metal layer that overlies said inner periphery of said magnet sheath; two contact pads covering said filler and being connected to said conductive metal layer overlying said outer surfaces of said first dielectric isolation layer and said second dielectric isolation layer; and an insulating protection layer and an electrical connection line unit, said insulating protection layer covering a portion of said conductive metal layer formed on said first dielectric isolation layer and exposing one of said contact pads, said electrical connection line unit being connected to said one of said contact pads.

2. The circuit carrier board as claimed in claim 1, which functions as an inductor.

3. The circuit carrier board as claimed in claim 1, wherein said first magnetic surface and said second magnetic surface are flush with said first substrate surface and said second substrate surface, respectively.

4. The circuit carrier board as claimed in claim 1, wherein said filler is one of a conductive filler and an insulating filler.

5. The circuit carrier board as claimed in claim 1, wherein said conductive metal layer and said contact pads constituting a conductive unit, a perpendicular projection of said conductive unit onto one of said first magnetic surface and said second magnetic surface of said magnet sheath has a maximum width no greater than a width of said one of said first magnetic surface and said second magnetic surface of said magnet sheath.

6. The circuit carrier board as claimed in claim 1, wherein said conductive metal layer and said contact pads constituting a conductive unit, a perpendicular projection of said conductive unit onto one of said first magnetic surface and said second magnetic surface of said magnet sheath has a minimum width no greater than a width of said one of said first magnetic surface and said second magnetic surface of said magnet sheath.

7. The circuit carrier board as claimed in claim 1, wherein a perpendicular projection of said conductive metal layer onto one of said first magnetic surface and said second magnetic surface of said magnet sheath has a maximum width no greater than a width of said one of said first magnetic surface and said second magnetic surface of said magnet sheath.

8. The circuit carrier board as claimed in claim 1, wherein a perpendicular projection of said conductive metal layer onto one of said first magnetic surface and said second magnetic surface of said magnet sheath has a minimum width no greater than a width of said one of said first magnetic surface and said second magnetic surface of said magnet sheath.

9. The circuit carrier board as claimed in claim 1, wherein said substrate hole of said substrate tapers in a direction from said first substrate surface to said second substrate surface.

10. The circuit carrier board as claimed in claim 1, wherein said substrate is a silicon substrate, a glass substrate, a ceramic substrate, a copper foil substrate, or combinations thereof.

11. The circuit carrier board as claimed in claim 1, further comprising a soldering material and a groove, said soldering material being disposed on said conductive metal layer for placement of an optical component or an electrical component, said groove being recessed into said substrate for placement of an optical component and having a V shaped or a U shaped cross-section.

12. The circuit carrier board as claimed in claim 1, wherein each of said first dielectric isolation layer and said second dielectric isolation layer has a material selected from bismaleimie triacine, ajinomoto build-up film, polypropylene, prepreg, epoxy, polyimide, polydimethylsiloxane, parylene, photoimageable dielectric, silicon dioxide, silicon nitride, and combinations thereof.

13. The circuit carrier board as claimed in claim 1, wherein said magnet sheath further includes an outer periphery that is opposite to said inner periphery of said magnet sheath, said first magnetic surface and said second magnetic surface contacting respectively said first dielectric isolation layer and said second dielectric isolation layer, said inner periphery of said magnet sheath contacting said conductive metal layer, said outer periphery of said magnet sheath contacting said hole boundary of said substrate hole.

14. The circuit carrier board as claimed in claim 1, wherein said inner periphery is parallel to said hole boundary of said substrate hole.

15. The circuit carrier board as claimed in claim 1, wherein said magnet sheath is made of a material that includes an organic polymer resin, a conductive magnetic material, a curing agent, a filler, and an addictive.

* * * * *